(12) United States Patent
Keh et al.

(10) Patent No.: US 7,158,550 B2
(45) Date of Patent: Jan. 2, 2007

(54) OPTICAL ELEMENT MODULE PACKAGE AND METHOD FOR MANUFACTURING THE SAME

(75) Inventors: Yong-Chan Keh, Suwon-shi (KR); Mun-Kue Park, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 352 days.

(21) Appl. No.: 10/685,910

(22) Filed: Oct. 15, 2003

(65) Prior Publication Data

US 2004/0247004 A1 Dec. 9, 2004

(30) Foreign Application Priority Data

Jun. 4, 2003 (KR) ............... 10-2003-0035965

(51) Int. Cl.
*H01S 3/04* (2006.01)
(52) U.S. Cl. .................................. 372/36; 372/34
(58) Field of Classification Search ............ 372/36, 372/103, 29.02, 34
See application file for complete search history.

(56) References Cited

U.S. PATENT DOCUMENTS

| | | | | |
|---|---|---|---|---|
| 5,089,861 A | * | 2/1992 | Tanaka et al. | 372/36 |
| 5,252,856 A | * | 10/1993 | Murai | 257/678 |
| 5,519,720 A | * | 5/1996 | Hirano et al. | 372/36 |
| 5,974,066 A | * | 10/1999 | Wu et al. | 372/50.124 |
| 6,795,461 B1 | * | 9/2004 | Blair et al. | 372/36 |
| 6,868,105 B1 | * | 3/2005 | Yagi et al. | 372/36 |
| D505,664 S | * | 5/2005 | Takagi et al. | D13/182 |

FOREIGN PATENT DOCUMENTS

| | | |
|---|---|---|
| CN | 1108812 | 9/1995 |
| CN | 1313661 | 9/2001 |
| JP | 04-133480 | 5/1992 |
| JP | 11-231173 | 8/1999 |
| JP | 2002-289961 | 10/2002 |
| JP | 2003-037329 | 2/2003 |
| JP | 2003-110181 | 4/2003 |

\* cited by examiner

*Primary Examiner*—Minsun Oh Harvey
*Assistant Examiner*—Tuan Nguyen
(74) *Attorney, Agent, or Firm*—Cha & Reiter, LLC

(57) ABSTRACT

An optical element module package with a TO-can structure is disclosed. The module includes a laser diode for projecting optical signals and a photo diode for monitoring the optical signals projected from the laser diode. The package includes a stem having a first through-hole formed in a long-hole shape parallel to the diametrical direction of the stem, the first through-hole extending through the stem from one side to the other; and a plurality of leads arranged in a row through the first through-hole. The first through-hole is filled with a sealant of a glass material so that the stem and the leads are fixed.

12 Claims, 5 Drawing Sheets

OPTICAL ELEMENT MODULE PACKAGE AND METHOD FOR MANUFACTURING THE SAME

CLAIM OF PRIORITY

This application claims priority to an application entitled "optical element module package and method for manufacturing the same," filed with the Korean Intellectual Property Office on Jun. 4, 2003 and assigned Serial No. 2003-35965, the contents of which are hereby incorporated by reference.

BACKGROUND OF THE INVENTION

1. Field of the Invention

The present invention relates to an optical element module, and more particularly to an optical element module package having a TO-can structure and a method for manufacturing the same.

2. Description of the Related Art

In general, an optical element module, mounted on an electric circuit device (e.g., a printed circuit board), modulates radio-frequency signals into optical signals. Due to a rapid development in the information industry, there is an increasing trend to transmit information by means of an optical communication network as a result of faster and larger data capacity demands. Traditionally, a TO-can structure package has been used in inexpensive optical element modules and is now also being applied to fast, large-data capacity optical element modules.

FIG. 1 is a perspective view showing a conventional optical element module package 100 having a TO-can structure. As shown, the optical element module package 100 includes a stem 101 having a heat sink block 111 protruding from one end thereof and a plurality of leads 102 at the other end. The leads 102 are comprised of a laser diode anode lead, a laser diode 103, a cathode lead, a photo diode anode lead 102, and a photo diode cathode lead 102. In general, the laser diode anode lead is electrically connected to the stem 101, RF signal, combined with DC bias current by external bias-tee is inputted to laser diode cathode lead. The laser diode 103 and the photo diode 104, which detects light emitted from the laser diode 103, are installed on the stem 101. The laser diode 103 is mounted on the heat sink block 111, and the laser diode 103 and the photo diode 104 are connected with the corresponding leads 102 via a wire bonding method.

The leads 102 are coaxially aligned with the respective through-holes 113 extending through the stem 101 therethrough. The through-holes 113 are then filled with a sealant 105 of a glass material. The sealant 105 is melted to hold the leads 102 together with the stem 101 and to seal the through-holes 113 at the same time.

The above package having a TO-can structure is available from Luminent Inc. and distributed under a product named "C-13-DFB10-TJ-SLC21". However, this type of optical element package is not suitable for a high-speed transmission above several Gbps because the package may suffer from an inherent inductance of its leads, a parasitic capacitance between its leads and stem, and a characteristic impedance mismatch that may occur while radio-frequency signals inputted from outside pass through the respective leads. Moreover, the manufacturing procedure is inconvenient as the respective leads must be aligned with a plurality of through-holes in the stem and the though-holes must be sealed individually.

FIG. 2 is a perspective view showing another conventional optical element module package 200, which has a TO-can structure using a ceramic feedthrough. As shown, the optical element module package 200 includes a stem 201 having a heat sink block 211 protruding from one end thereof and a ceramic-laminated feedthrough 203 inserted into the stem 201. The feedthrough 203 is positioned on the heat sink block 211 and has a coplanar waveguide (CPW) 202 formed on its surface. The CPW-type package 200 receives radio-frequency signals from outside via leads 204. This type of CPW-package is sold under the product name of "TO TX PKG A2527" by Kyocera Corp.

The above package has some drawbacks. First, the feedthrough 203, having a ceramic-laminated structure, is formed through a low temperature co-fired ceramic (LTCC) process at the temperature up to 800–1000° C. Such a high temperature process increases the manufacturing cost. In addition, it is difficult to guarantee a hermeticity between the feedthrough 203 and the stem 201. Furthermore, the adhesive strength between the leads 204 and the feedthrough 203 is weak. All these factors leads to an unreliable product.

SUMMARY OF THE INVENTION

Accordingly, the present invention has been made to overcome the above-mentioned problems and to provide additional advantages, by introducing a package applicable to a fast, large-capacitance optical element module owing to its excellent radio-frequency characteristics and a method for manufacturing the same.

One aspect is that the present invention may be realized in a simple, reliable, and inexpensive implementation.

In another aspect, there is provided an optical element module package with a TO-can structure having a laser diode for projecting optical signals and a photo diode for monitoring the optical signals projected from the laser diode. The package includes: a stem having a first through-hole formed in a long-hole shape parallel to the diametrical direction of the stem, the first through-hole or an elongated through-hole extending through the stem from one side to the other; and, a plurality of leads arranged in a row through the first through-hole, wherein the first through-hole is filled with a sealant of a glass material so that the stem and the leads are fixed.

In yet another aspect of the present invention, there is provided a method for manufacturing an optical element module package including a laser diode and a photo diode. First, a stem having a through-hole formed in a long-hole shape extending parallel to the diametrical direction of the stem is provided, then a lead frame having a plurality of leads extending in a direction away from a plate is provided. The ends of the leads are inserted into the through-hole from a side of the stem and the ends are aligned. Thereafter, the through-hole is hermetically sealed with a sealant of a glass material.

BRIEF DESCRIPTION OF THE DRAWINGS

The above features and advantages of the present invention will become more apparent from the following detailed description taken in conjunction with the accompanying drawings, in which.

DETAILED DESCRIPTION OF THE PREFERRED EMBODIMENT

Hereinafter, an optical element module package and a method for manufacturing the same according to preferred embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
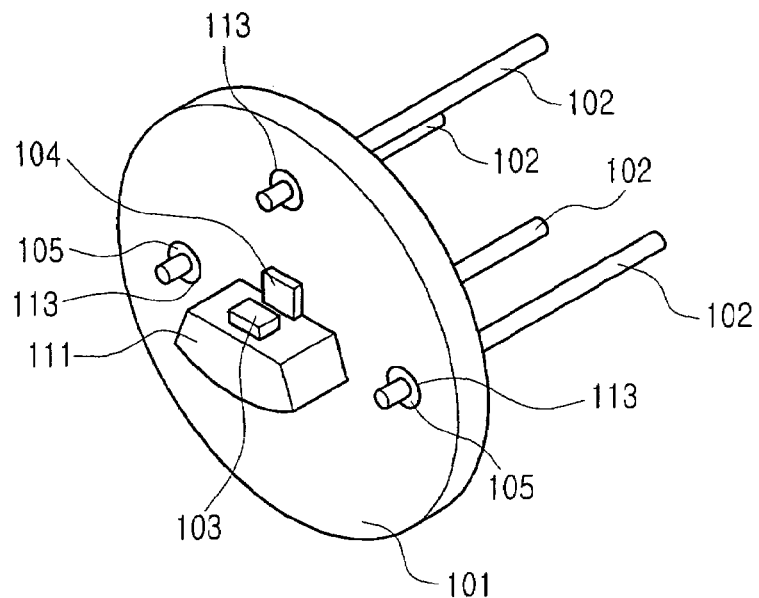
FIG. 1 is a perspective view showing an embodiment of an optical element module package according to the prior art.
Figure 2:
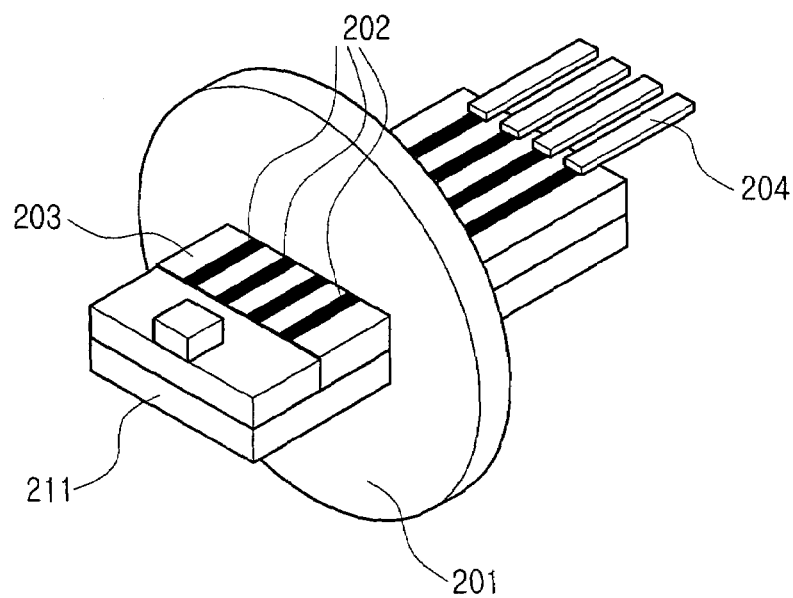
FIG. 2 is a perspective view showing another embodiment of an optical element module package according to the prior art.
Figure 3:
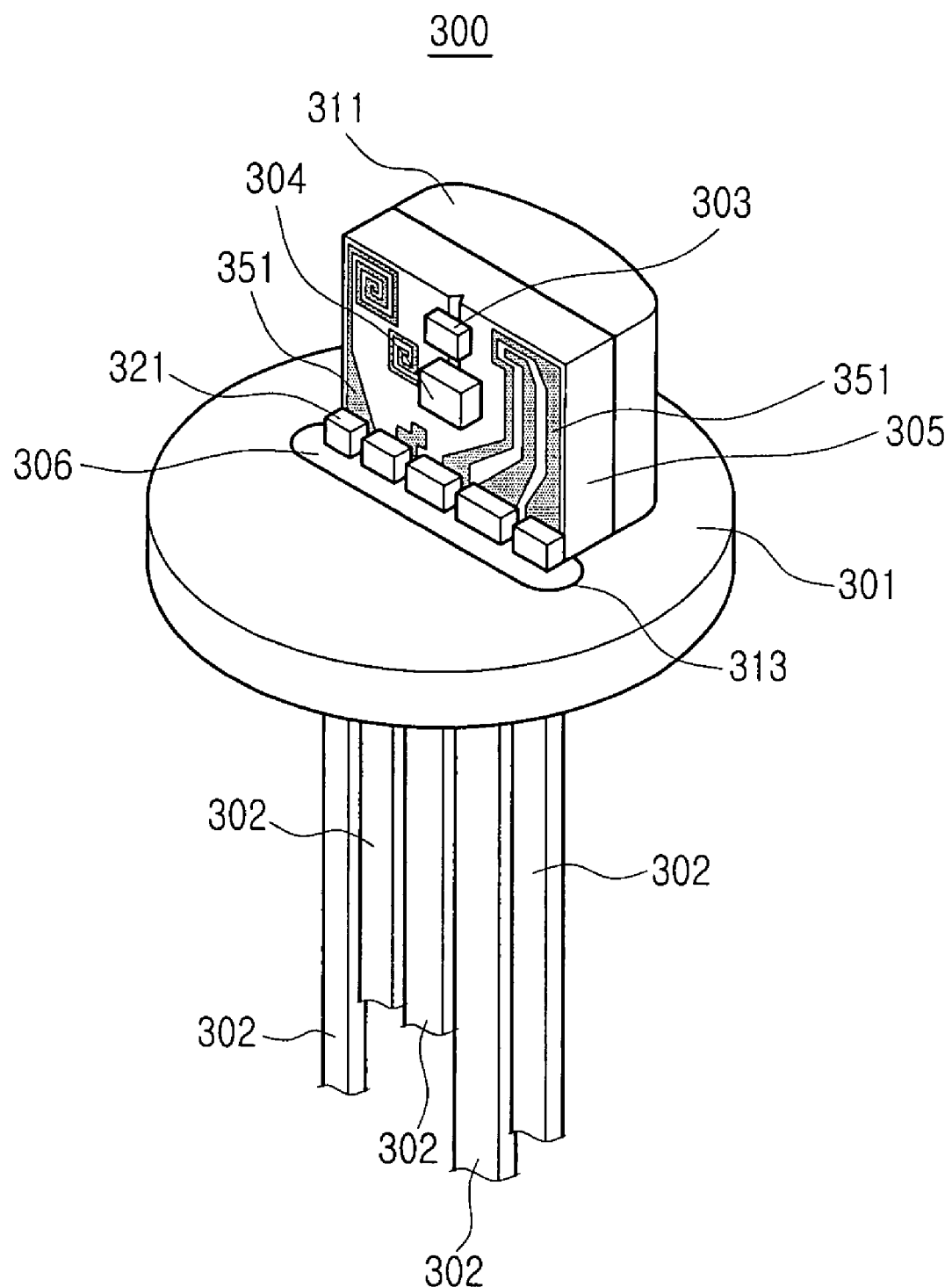
FIG. 3 is a perspective view showing a first preferred embodiment of an optical element module package according to the present invention.
Figure 4:
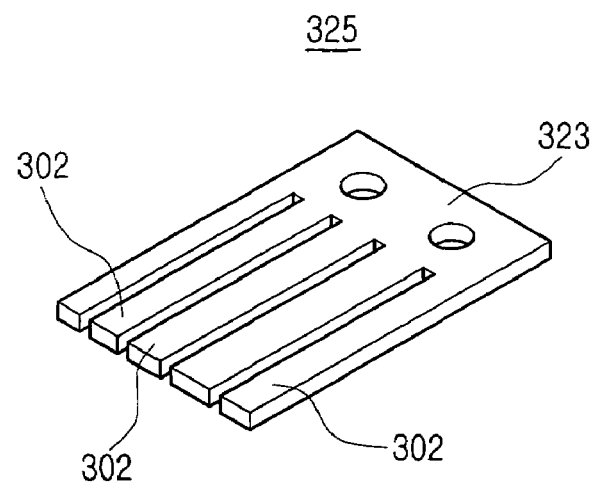
FIG. 4 is a perspective view showing a lead frame before the leads, shown in FIG. 3, are assembled.
Figure 5:
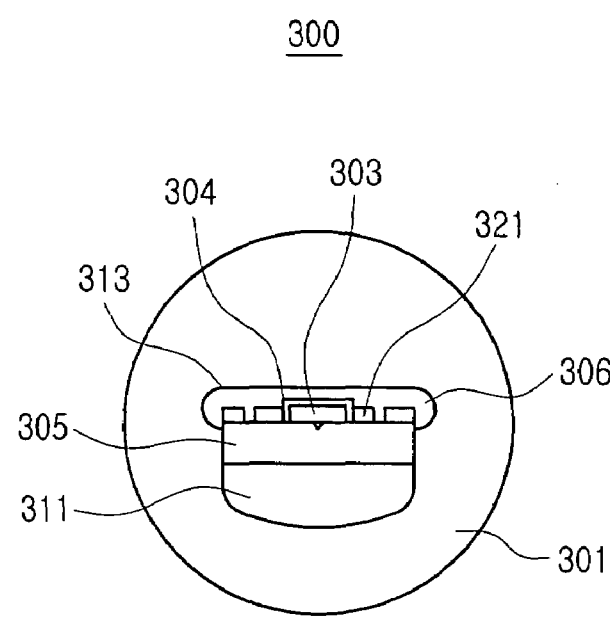
FIG. 5. is a top view showing the optical element module package shown in FIG. 3.

As shown in FIGS. 3 to 5, an optical element module package 300 according to a first preferred embodiment of the present invention includes a stem 301 having a heat sink block 311 formed at one end thereof, a sub-mount 305 having a laser diode 303 and a photo diode 304 mounted thereon, and a plurality of leads 302 formed at the other end. In operation, the package 300 projects optical signals when radio-frequency signals are applied to the laser diode 303 and the photo diode 304 mounted on the sub-mount 305.

The stem 301 has an elongated through-hole 313 extended parallel to the diametrical direction of the stem 301, such that the elongated through-hole 313 extends through the stem 301 from one side to the other. The stem 301 also has a heat sink block 311 protruding from one end thereof.

The sub-mount 305 is mounted on the side of the heat sink block 311, which is adjacent to the elongated through-hole 313. The sub-mount 305 is mounted with a laser diode 303 for modulating radio-frequency signals into optical signals and a monitoring photo diode 304 for detecting the optical signals projected from the laser diode 303. The photo diode 304 detects the light emitted from the back side of the laser diode 303 to check whether the laser diode 303 is functioning properly and to perform an automatic power control (APC).

The sub-mount 305 may be made of a silicon optical bench (hereinafter, referred to as "SiOB") having a circuit pattern 351 formed on a surface thereof. The circuit pattern 351 is formed by a thin film process and may include a choke inductor, an impedance matching resistor, and the like. The laser diode 303 and the photo diode 304 are mounted on the SiOB 305. The photo diode 304 detects the light emitted from the back side of the laser diode 303. The plurality of leads 302 extend through the elongated through-hole 313 with one ends 321 protruding from the upper surface of the stem 301. The leads 302, as shown, are provided with a DC bias lead connected to the laser diode 303, a lead connected to the photo diode 304 and three radio-frequency leads. The radio-frequency leads consist of a radio-frequency signal lead and a pair of surrounding ground leads. The leads 302 provide the laser diode 303 with radio-frequency signals inputted from outside via the circuit pattern 351 of the SiOB 305.

The leads 302 are fixed at the stem 301 by means of a sealant 306 of a glass material filled in the elongated through-hole 313. The sealant 306 is filled in the elongated through-hole 313, in which the leads 302 have been aligned, in a glass seal power state. The sealant 306 is then melted at a temperature of about 500° C. to seal the elongated through-hole 313.

Note that in order to prevent any distortion or loss of the radio-frequency signals applied to the optical element module package 300, the package requires a characteristic impedance matching. The output impedance of a laser diode driver (LDD) IC or a pulse pattern generator (PPG), which are currently in commercial use, is set to 25Ω or 50Ω. The characteristic impedance of the optical element module package 300 can be matched to the output impedance of these LLD and PPG by modifying, e.g., the dielectric constant of the sealant of a glass material or the dimensions of the leads 302.

Figure 6:
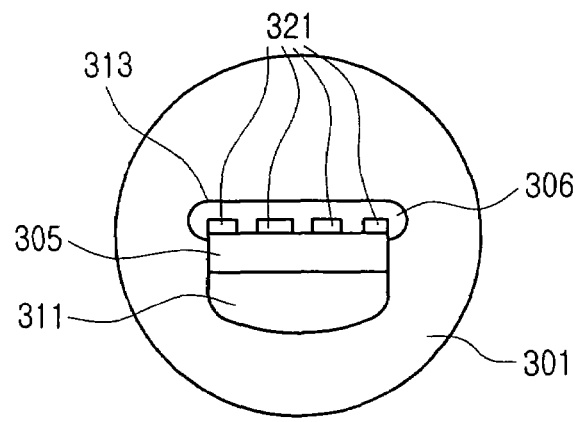
FIG. 6 is a top view showing a second preferred embodiment of an optical element module package according to the present invention.

FIG. 6 is a top view showing an optical element module package 400 according to a second embodiment of the present invention. The construction and operation of the second embodiment are essentially the same as that described above with respect to FIG. 3. except that it has four leads 302. Hence, the discussion of similar components described in the preceding paragraphs is omitted to avoid redundancy, as they are described with respect to FIG. 3. The second embodiment provides four leads 302 as the pair of ground leads in the first embodiment is reduced to a single ground lead. Such a reduction in the number of the ground lead makes it easy to assemble the package 400 onto a printed circuit board by ensuring a enough distance between each of the leads.

Figure 7:
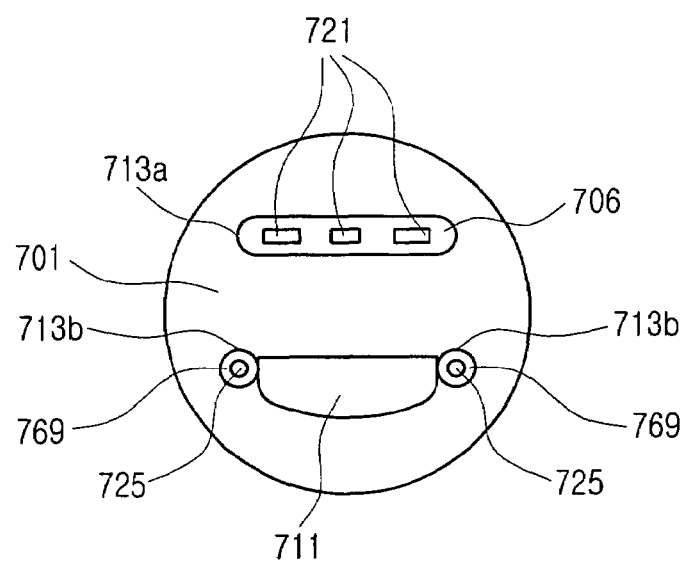
FIG. 7 is a top view showing a third preferred embodiment of an optical element module package according to the present invention.

FIG. 7 is a top view showing an optical element module package 700 according to a third preferred embodiment of the present invention. In this embodiment, a radio-frequency signal lead and a pair of ground leads, constituting a radio-frequency lead 721 as a group, are held in a first through-hole 713a formed in the form of a long-hole shape of a stem 701. Then, the leads 725 are held in each pair of the second through-holes 713b, which are formed at both sides of a heat sink block 711. The leads 725 constitute a DC bias lead and a lead for a photo diode. After the leads are aligned, the first and second through-holes 713a, 713b are filled with sealants 706, 769 of a glass material.

When the optical element module package 700, as constructed above, is assembled onto a printed circuit board, the radio-frequency lead 721, provided in the first through-hole 713a, is electrically connected to the upper side of the board, and the leads 725 provided in the second through-holes 713b are electrically connected to the lower side of the board. The distance between the first and second through holes 713a, 713b can be modified in accordance with the thickness of the printed circuit board or vice versa. This ensures a larger distance between the leads 721, 725 for easier assembly.

Figure 8:
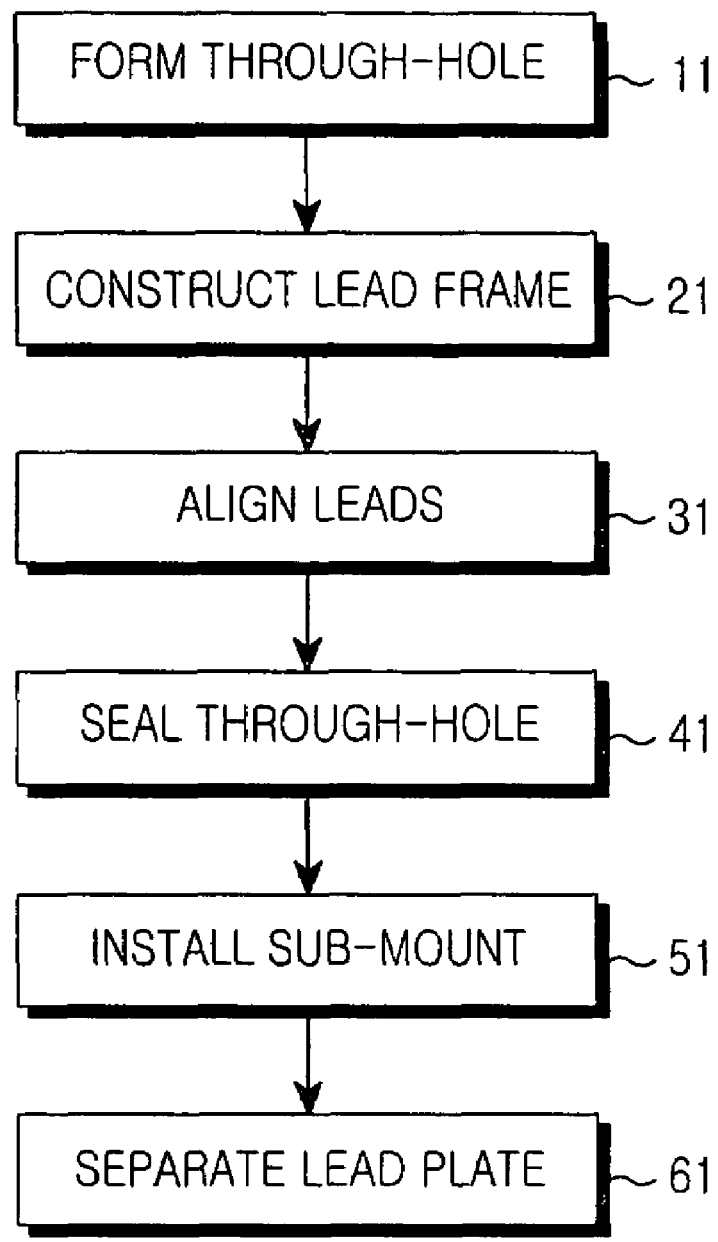
FIG. 8 is a flow chart illustrating a method for manufacturing an optical element module package according to the embodiment of the present invention.

Referring to FIG. 8, a method for manufacturing an optical element module package 300 consists of a step 11 of providing a stern 301 having a elongated through-hole 313 formed in a long-hole shape; a step 21 of providing a lead frame 325 having a plurality of leads 302 extending in a direction from a plate 323; a step 31 of aligning the leads 302 in the through-hole 313; a step 41 of sealing the elongated through-hole 313 with a sealant 306 of a glass material; a step 51 of mounting a sub-mount 305, having a laser diode 303 and a photo diode 304 mounted thereon, to a heat sink block 311; and, a step 61 of removing the plate 323 of the lead frame 325 to separate each of the leads 302.

When the leads 302 are aligned in the elongated through-hole 313, the ends 321 of the leads 302 must protrude up to a determined height from one end of the stem 301. After the elongated through-hole 313 is filled with a sealant of a glass material, the sealant is heated above a temperature of 500° C. The sealant is then melted and affixed within the through-hole to hold the stem 301 and the leads 302.

Referring back to FIG. 4, the leads 302 are configured as a lead frame 325 extending from an initial plate 323 in a direction. The lead frame 325 is inserted into the elongated through-hole 313 of the stem 301 and then aligned so that each end 321 (shown in FIG. 3) of the leads 302 protrudes from one end of the stem 301, preferably where the heat sink block 311 has been formed. When the lead frame 325 is aligned in the elongated through-hole 313, the leads 302 are held in the elongated through-hole 313 by means of the sealant 306 of a glass material. After the leads 302 are fixed, the plate 323 is removed from the leads 302. This process makes it easy to assemble a plurality of leads at the same time.

As mentioned above, the optical element module package according to the present invention uses a sealant of a glass material to hold a plurality of leads in a stem of a metallic material. Therefore, the package has excellent thermal, radio-frequency characteristics and, at the same time, it is easily manufactured with little cost. Furthermore, the package provides through-holes filled with a sealant of a glass material and a coplanar waveguide structure surrounded by them. This enables an impedance matching of 25Ω or 50Ω and reduces a parasitic impedance component to improve the radio-frequency characteristics. In addition, the package can be assembled onto a printed circuit board in a convenient way because the leads are arranged in a row on the stem. The use of a lead frame makes it possible to design the coplanar waveguide of the leads as desired and simplify the stem assembly process. Since a plurality of leads, arranged in a row, are inserted into the stem and aligned, manufacturing efficiency is improved and manufacturing cost is reduced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An optical element module package comprising:
   a laser diode for projecting optical signals;
   a photo diode for monitoring the optical signals projected from the laser diode;
   a stem having a first through-hole formed in a long-hole shape that is parallel to the diametrical direction of the stem;
   a heat sink block protruding from one end of the stem, the heat sink block being adjacent to the first through-hole;
   a sub-mount attached to one end of the heat sink block, the sub-mount having a circuit pattern formed on a surface thereof, wherein the sub-mount is mounted with the laser diode and the photo diode; and
   a plurality of leads arranged in a row and provided in the first through-hole,
   wherein the first through-hole is filled with a sealant of a glass material so that the stem and the plurality of leads are held together.

2. The optical element module package according to claim 1, wherein the plurality of leads includes a DC bias lead for the laser diode, a radio-frequency signal lead, a lead for the monitoring photo diode, and at least one ground lead.

3. The optical element module package according to claim 1, wherein the plurality of leads include at least one ground lead and a radio-frequency signal lead for the laser diode.

4. The optical element module package according to claim 1, wherein the sub-mount contains a 'V' shaped notch disposed at one end of the submount.

5. A method for manufacturing an optical element module package comprising the steps of:
   providing a laser diode for projecting optical signals;
   providing a photo diode for monitoring the optical signals projected from the laser diode;
   providing a stem having an elongated through-hole formed in a long-hole shape extending parallel to the diametrical direction of the stem;
   providing a heat sink block protruding from a side of the stem, the heat sink block being adjacent to the through-hole;
   mounting a sub-mount to one end of the heat sink block;
   forming a circuit pattern formed on a surface of the sub-mount;
   mounting the laser diode and the photodiode on the sub-mount;
   providing a lead frame having a plurality of leads extending in a direction away from a plate;
   inserting the ends of the leads into the through-hole from one end of the stem and aligning the ends of the leads; and
   sealing the through-hole with a sealant of a glass material.

6. The method according to claim 5, wherein the sealant is melted at a temperature of about 500° C. to seal the through-hole.

7. The method according to claim 5, further comprising the steps of providing the sub-mount with a 'V' shaped notch.

8. An optical element module package having a laser diode for projecting optical signals and a photo diode for monitoring the optical signals projected from the laser diode, comprising:
   a stem having a first through-hole formed in a long-hole shape and a pair of second through-holes formed on the stem; and
   a radio-frequency lead provided in the first through-hole and a plurality of leads provided in the second through-holes;
   wherein the radio frequency lead comprises a radio-frequency signal led and a pair of ground leads;
   wherein the plurality of leads constitute a DC bias lead and lead for a photo diode.

9. The optical element module package according to claim 8, wherein the optical element module package is adaptively assembled onto a printed circuit board, so that the radio-frequency lead provided in the first through-hole is electrically coupled to the upper top side of the circuit board, and the plurality of leads provided in the second through-holes are electrically coupled to the lower side of the circuit board.

10. The optical element module package according to claim 9, wherein the distance between the first and second through holes is selectively adjusted in accordance with the thickness of the circuit board.

11. The optical element module package according to claim 8, wherein the stem has a heat sink block protruding from one end thereof, the heat sink block being positioned between the second through-holes adjacent to the first through-hole.

12. The optical element module package according to claim 8, wherein the first and second through-hole is filled with a sealant of a glass material so that the stem and all leads are held together.

* * * * *